United States Patent [19]

Takabayashi et al.

[11] Patent Number: 5,270,848
[45] Date of Patent: Dec. 14, 1993

[54] LIQUID CRYSTAL ITO CONNECTOR HAVING A METAL LAYER

[75] Inventors: Hiroshi Takabayashi, Kawasaki; Masanori Takahashi, Chigasaki; Hideo Mori, Fujisawa, all of Japan

[73] Assignee: Canon Kabushiki Kaisha, Tokyo, Japan

[21] Appl. No.: 757,987

[22] Filed: Sep. 12, 1991

[30] Foreign Application Priority Data

Sep. 13, 1990 [JP] Japan .................. 2-241164
Aug. 27, 1991 [JP] Japan .................. 3-215272

[51] Int. Cl.$^5$ ........................... G02F 1/1343
[52] U.S. Cl. ........................... 359/88
[58] Field of Search ........................... 359/88

[56] References Cited

U.S. PATENT DOCUMENTS

| | | | |
|---|---|---|---|
| 4,824,213 | 4/1989 | Morokawa | 359/88 |
| 4,935,757 | 6/1990 | Hatano et al. | 359/88 |
| 4,964,700 | 10/1990 | Takabayashi | 359/88 |

FOREIGN PATENT DOCUMENTS

| | | | |
|---|---|---|---|
| 0344367 | 12/1988 | European Pat. Off. | |
| 0385787 | 9/1990 | European Pat. Off. | |
| 0422906 | 4/1991 | European Pat. Off. | 359/88 |
| 59-129833 | 11/1984 | Japan | |
| 61-174507 | 8/1986 | Japan | 359/88 |

OTHER PUBLICATIONS

Masuda et al., "Chip on Glass Technology etc." Proc. 6yh IEEE/CHMT Intl. Elec. Manuf. Tech. Symposium, Apr. 26, 1989, pp. 55-58.

*Primary Examiner*—William L. Sikes
*Assistant Examiner*—Ron Trice
*Attorney, Agent, or Firm*—Fitzpatrick, Cella, Harper & Scinto

[57] ABSTRACT

A liquid crystal apparatus includes a liquid crystal panel side electrode extending from a liquid crystal panel and an external circuit side electrode extending from an external circuit and connected to the liquid crystal panel side electrode for driving the liquid crystal panel, by using conductive material. The liquid crystal panel side electrode includes a laminated film made of an indium tin oxide film having a surface and a metal film on the surface. The metal film is selected from one of a molybdenum film and an aluminum film. The liquid crystal panel side electrode has a left portion of the metal film and an indium tin oxide film opening area, at a connection area between the liquid crystal panel side electrode and the external circuit side electrode. The indium tin oxide film of the liquid crystal panel side electrode is covered with the metal film over the entire surface thereof. The liquid crystal panel side electrode is formed in a stripe shape, and the left portion of the metal film of the liquid crystal panel side electrode at the connection area is formed to have a width 1/30 to ⅓ times as narrow as a width of the stripe.

4 Claims, 7 Drawing Sheets

FIG. 12

LIQUID CRYSTAL ITO CONNECTOR HAVING A METAL LAYER

BACKGROUND OF THE INVENTION

1. Field of the Invention

The present invention relates to a liquid crystal apparatus having an external drive circuit connected thereto.

2. Related Background Art

Conventionally, a liquid crystal panel and an external drive circuit are mechanically and electrically connected together by a widely known method whereby a connection electrode of a film carrier tape on which a drive IC for example is mounted, is positioned facing an indium tin oxide (ITO) electrode of a liquid crystal panel, and both of the electrodes are mechanically and electrically connected together by thermocompression bonding using an isotropic conductive adhesive agent made of resin particles coated with metal particles or metal plated.

Another method is also known whereby a metal bump is formed on a connection electrode of a drive IC, and conductive paste or metal particles are interposed between the metal bump and the ITO electrode of a liquid crystal panel to mechanically and electrically connect together the metal bump and the ITO thin film.

According to the conventional technique, the wiring resistance from the external drive circuit to the liquid crystal material mainly depends on the wiring resistance of the ITO electrode itself.

A drive signal supplied to the liquid crystal material is subject to a delay $\tau = RC$ where R is a wiring resistance from the external drive circuit to the liquid crystal material, and C is an electrostatic capacitance between the upper and lower electrodes. This delay leads to a small drive margin. A liquid crystal, particularly a ferroelectric liquid crystal, which requires a small cell gap such as about 2 microns, inevitably makes the electrostatic capacitance C very large. It therefore becomes necessary to reduce the wiring resistance as small as possible.

In view of the above circumstances, according to a conventional technique, a method has been used whereby a narrow stripe metal film made of molybdenum, aluminum or the like is provided on the ITO thin film of a transparent stripe conductive film wired within a liquid crystal.

Such a metal film on the ITO thin film is provided also at the area outside of the liquid crystal cell because even such a small area has a large wiring resistance. If a fine wire made of molybdenum film or aluminum film is used, electrolysis action may occur under the condition of, e.g., a presence of water contents so that the fine molybdenum or aluminum film is subject to corrosion and broken out. From this reason, the whole area of the ITS electrode outside of the liquid crystal cell is covered with the metal film.

The metal film is likely to have surface oxidation. Therefore, the surface is covered with a thin metal oxide film having a thickness of, e.g., about 1000 to 3000 angstroms. This metal oxide film is generally an insulating material. Therefore, in order to ensure electrical connection between the connection electrode of a film carrier tape and the metal film facing the connection electrode, hard metal particles (e.g., nickel) have been used which can break the oxide metal film. Use of nickel particles causes point contacts between the particles and the connection electrode, resulting in variations of wiring resistance. Furthermore, nickel particles may sometimes break the metal film together with the metal oxide film, lowering the reliability of electrical connection.

SUMMARY OF THE INVENTION

It is an object of the present invention to provide an electrical connection method capable of reducing a wiring resistance from an external drive circuit to a liquid crystal material while improving the reliability of electrical connection.

The above object of the present invention can be achieved by a provision of a liquid crystal apparatus wherein a liquid crystal panel side electrode extending from a liquid crystal panel is connected to an external circuit side electrode extending from an external circuit for driving the liquid crystal panel, by using conductive material, and wherein the liquid crystal panel side electrode is a laminated film made of an indium tin oxide film and a metal film, and the liquid crystal panel side electrode has a left portion of the metal film and an indium tin oxide film opening area, at a connection area between the liquid crystal panel side electrode and the external circuit side electrode.

DETAILED DESCRIPTION OF THE PREFERRED EMBODIMENTS

Figure 1A:
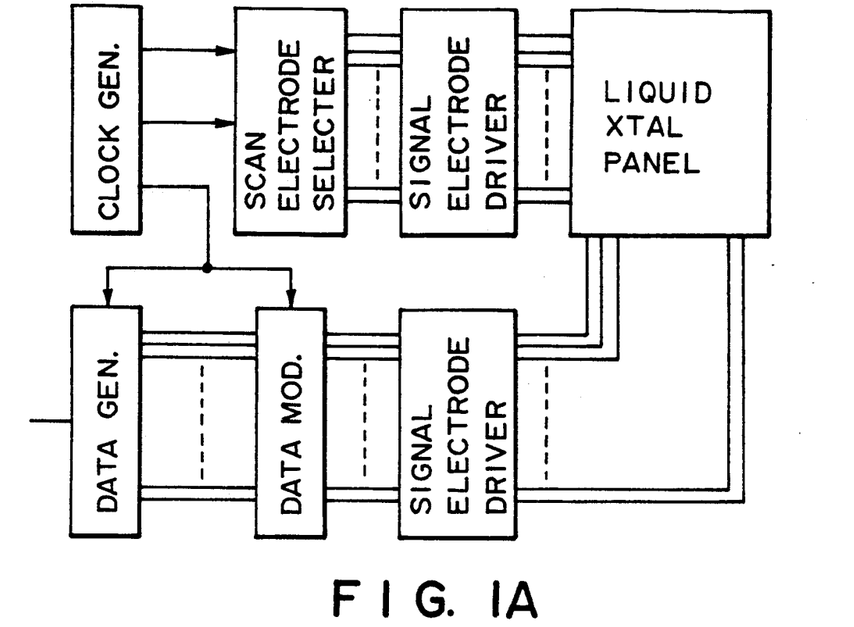
FIG. 1A is a block diagram showing the apparatus according to the present invention.
Figure 2:
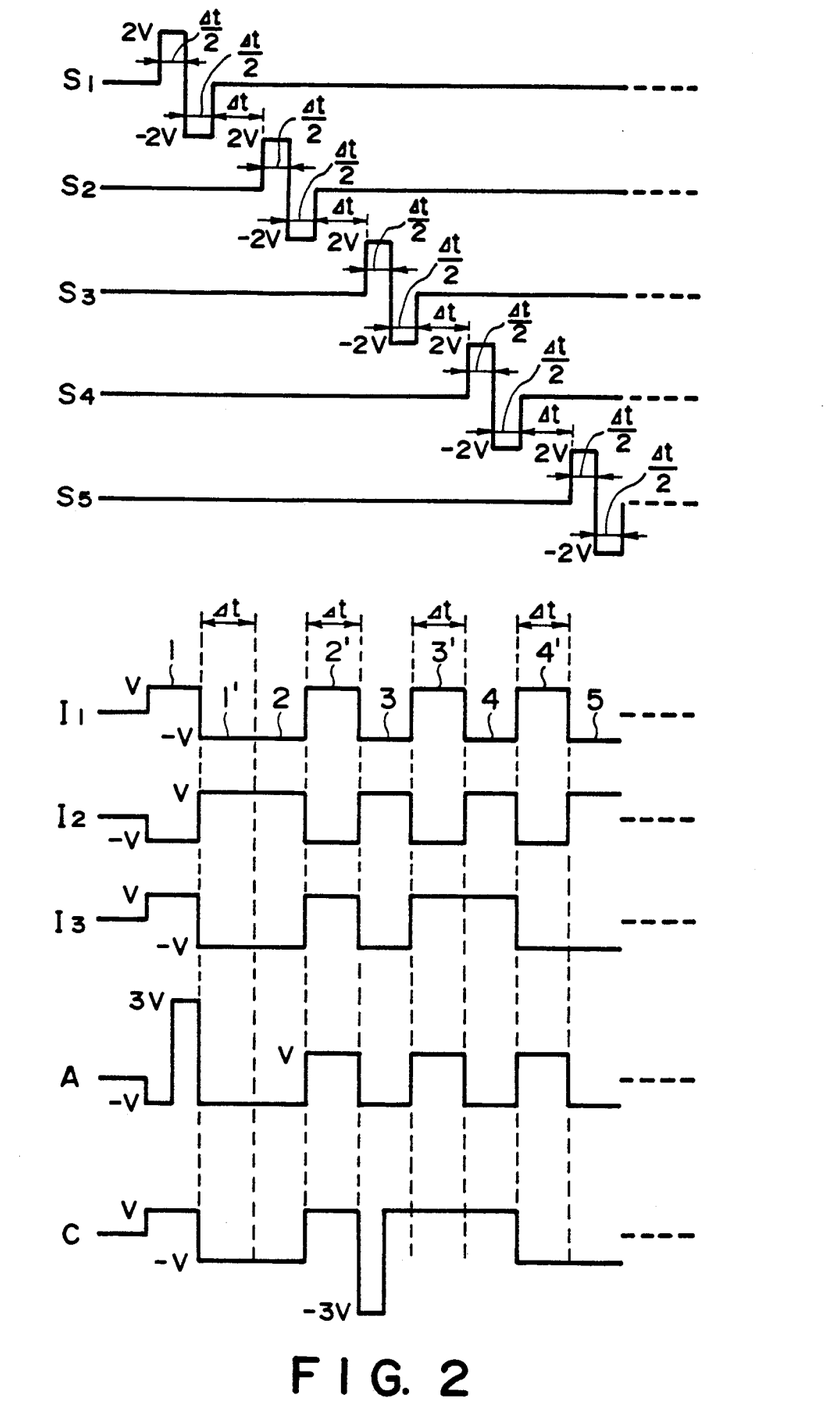
FIG. 2 shows the waveforms of drive voltage signals used for the apparatus according to the present invention.

FIG. 1A is a schematic diagram showing the electrical system for driving a ferroelectric liquid crystal cell in the manner as illustrated in FIG. 2. A clock signal (CS) generated by a clock generator is supplied to a scan electrode selector for selecting a scan electrode. A signal outputted from the scan electrode selector is supplied to a scan electrode driver to generate a signal to be supplied to a scan electrode group.

A data modulator capable of generating an information signal and an auxiliary signal is supplied with the clock signal (CS) and a data signal (DS) outputted from a data generator. The data modulator generates a data modulated signal (DM) which is supplied to a signal electrode driver and then to a signal electrode group.

Figure 1B:
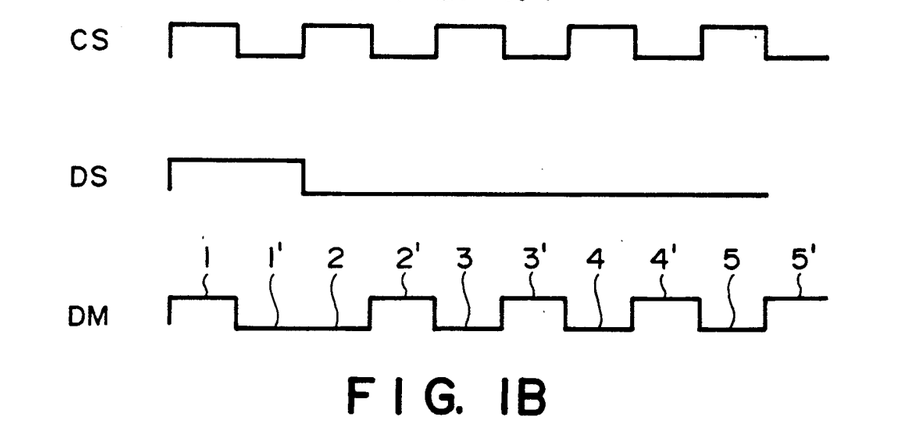
FIG. 1B shows how a data modulator output signal (DM) is formed, the signal being supplied to an information electrode group of the apparatus according to the present invention.

FIG. 1B shows examples of signals inputted to and outputted from the data modulator. The output signal corresponds to the signal $I_1$ shown in FIG. 2.

Figure 1C:
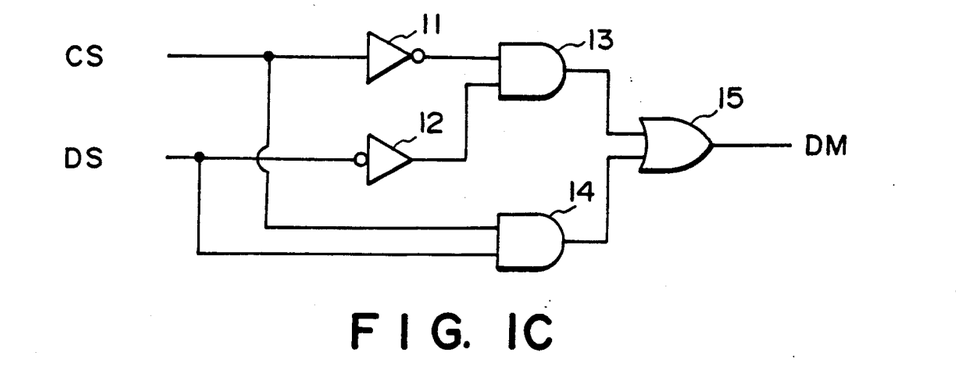
FIG. 1C is a circuit diagram of the circuit for forming the data modulator output signal (DM) shown in FIG. 1B.

FIG. 1C is a circuit diagram of the data modulator for outputting the data modulated signal (DM) shown in FIG. 1B. The modulator is constructed of two inverters 11 and 12, two AND gates 13 and 14, and an OR gate 15.

Signals $S_1$ to $S_5$ shown in FIG. 2 are scan signals applied to the scan electrodes of the matrix electrode group, and correspond to the signals outputted from the scan electrode driver shown in FIG. 1A. Signals $I_1$ to $I_3$ are information signals or data modulated signals applied to the information electrodes or signal electrodes of the matrix electrode group, and correspond to the signals outputted from the information electrode driver or signal electrode driver shown in FIG. 1A. Letter A represents a voltage waveform of a signal at an intersection point for the signals $S_1$ and $I_1$, and letter C represents a voltage waveform of a signal at an intersection point for the signals $S_3$ and $I_3$.

The external drive circuit of the liquid crystal apparatus shown in FIG. 1A includes a scan side drive circuit having the scan electrode selector and scan electrode driver, and an information side drive circuit having the data generator, data modulator, and signal electrode driver.

Figure 3:
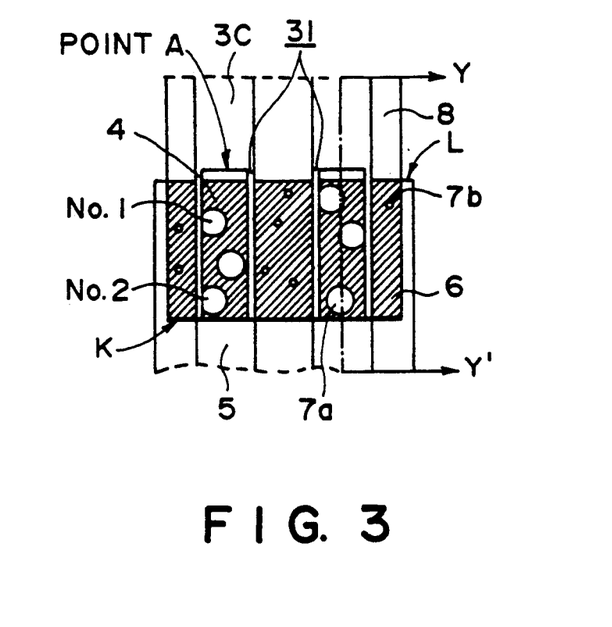
FIG. 3 is a plan view of the apparatus according to the present invention.
Figure 4:
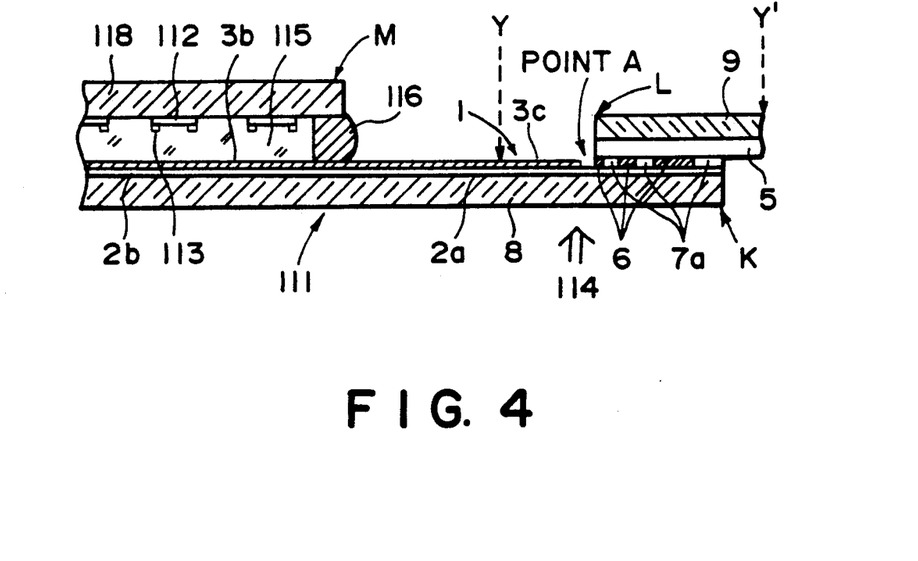
FIG. 4 is a cross section, taken along line Y—Y' of FIG. 3, of the apparatus according to the present invention.

FIG. 3 is a plan view of a substrate 8 of a liquid crystal panel 111 as viewed in the direction indicated by an arrow 114, the plan view showing the connection arrangement of the present invention. FIG. 4 is a cross section taken along line Y—Y' of FIG. 3. FIG. 7 is a plan view showing the connection arrangement to which the present invention is not applied (as viewed in the same direction as in FIG. 3).

A connection electrode 1 of the liquid crystal panel 111 (parallel electrodes each having a line width of 100 microns and a line space of 100 microns, the plan view being shown in FIG. 5) has a two-layer structure constructed of an ITO (indium tin oxide) thin film 2a of about 500 to 1500 angstroms, and a metal thin film 3a (e.g., molybdenum, aluminum) of about 1000 to 3000 angstroms. The metal thin film may be a laminated film having two or more layers. An ITO opening area 4 having a width of 80 microns is formed in the electrode 1 at the central area thereof, and the metal thin film 3a is left at opposite ends (side edge portions).

The liquid crystal panel 111 used in the present invention is provided with liquid crystal cells integrally formed with the substrate 8.

The cell structure of the liquid crystal cells is provided with the substrate 8 laminated with the metal thin film 3b and ITO thin film 2b, another substrate 118 facing the substrate 8, and liquid crystal material 115. The substrate 118 facing the substrate 8 is formed with a metal thin film 113 intersecting with the metal thin film 3b, and ITO thin film 112. The cell structure is sealed with sealing material 116 at the peripheral portion between the two substrates 118 and 8. An isotropic conductive film is interposed between the connection electrode 1 of the liquid crystal panel 111 and a connection electrode 5 of an external drive circuit. The connection electrode 5 may be, for example, a connection electrode on a film carrier having a base film 9, the electrode being made of copper. The isotropic conductive film is made of, for example, epoxy-based adhesive agent with solder particles being dispersed. Both of the electrodes are connected together by thermocompression bonding. Fine solder particles are melted and pressed through thermocompression so that they diffuse in the direction parallel to the substrate. It is therefore possible to obtain electrical contact of a large area as indicated at 7a in FIG. 3. In this case, solder particles present between the connection electrode 5 and the ITO thin film 2a (or 4) become electrical contacts 7a of a shape extending in the direction parallel to the substrate. However, solder particles not present between the connection electrode 5 and the ITO thin film are not pressed and left as solder particles 7b which do not contribute at all to electrical connection.

The connection electrode 1 of the liquid crystal panel 111 and the connection electrode 5 of the film carrier become in area contact with the solder particles 7a, providing a highly reliable electrical connection. The wiring resistance from the external drive circuit to the liquid crystal material 115 is reduced to a low value because of the metal thin film 3b on the connection electrode 1 of the liquid crystal panel 111.

The blank portion 31 shown in FIG. 3 corresponds to the area where the epoxy-based adhesive agent 6 indicated by hatched lines cannot be observed when the portion with the substrate 8 and base film 9 are facing each other is viewed in the direction indicated by the arrow 114, because the metal thin film 3a formed on the substrate 8 is opaque.

Figure 5A:
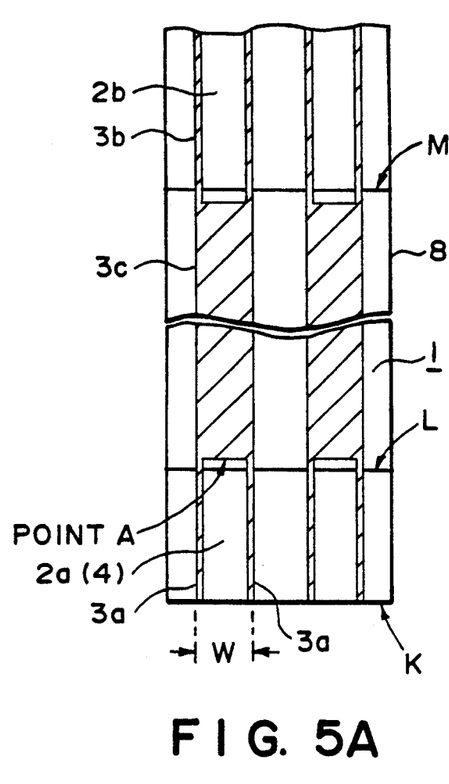
FIG. 5A is a plan view of the substrate 8 used in the present invention.
Figure 5B:
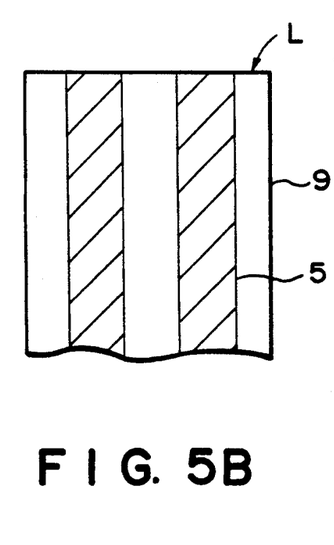
FIG. 5B is a plan view of the film carrier used in the present invention.
Figure 6:
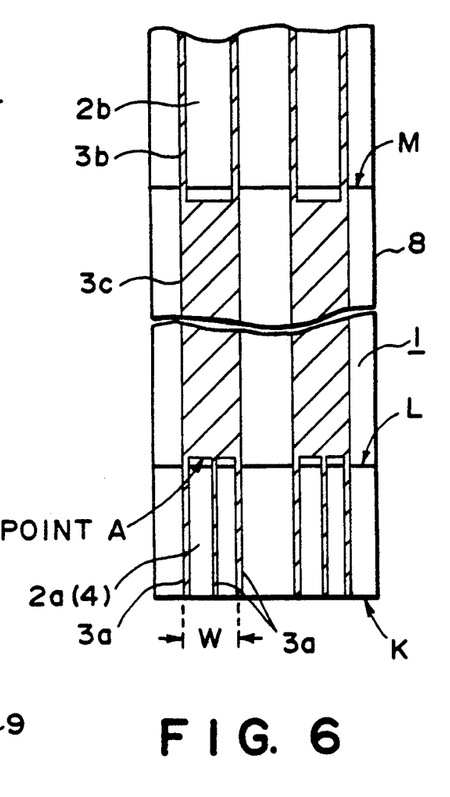
FIG. 6 is a plan view of another substrate 8 used in the present invention.

FIG. 6 shows another preferred embodiment of the present invention. The structure of this embodiment is the same as shown in FIG. 5 except that there are provided three narrow metal thin films 3a on an ITO thin film 2a.

The line width of a narrow metal thin film 3a used in the present invention is preferably about ⅓ to 1/30 time as narrow as the width W of the stripe metal thin film 3c. The width W is generally about 50 to 500 microns.

According to the present invention, as shown in FIGS. 5A and 5B and FIG. 6, the metal thin film 3c at the area outside of the liquid crystal cell preferably covers the whole area of the ITO thin film. The problem of corrosion or breakage to be caused by electrolysis action under a presence of water contents can be eliminated.

Figure 7A:
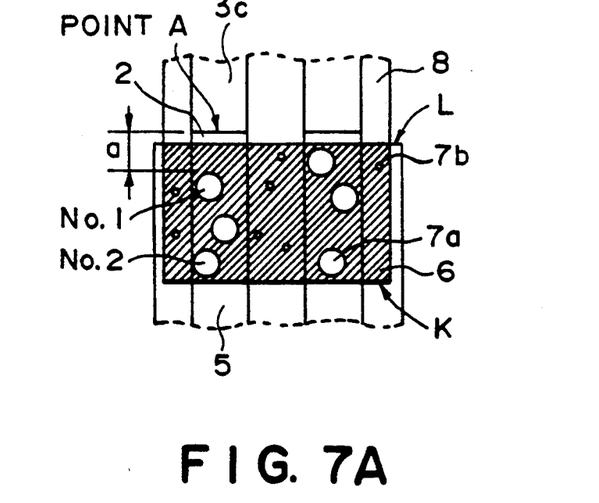
FIG. 7A is a plan view of an apparatus to which the present invention is not applied.
Figure 7B:
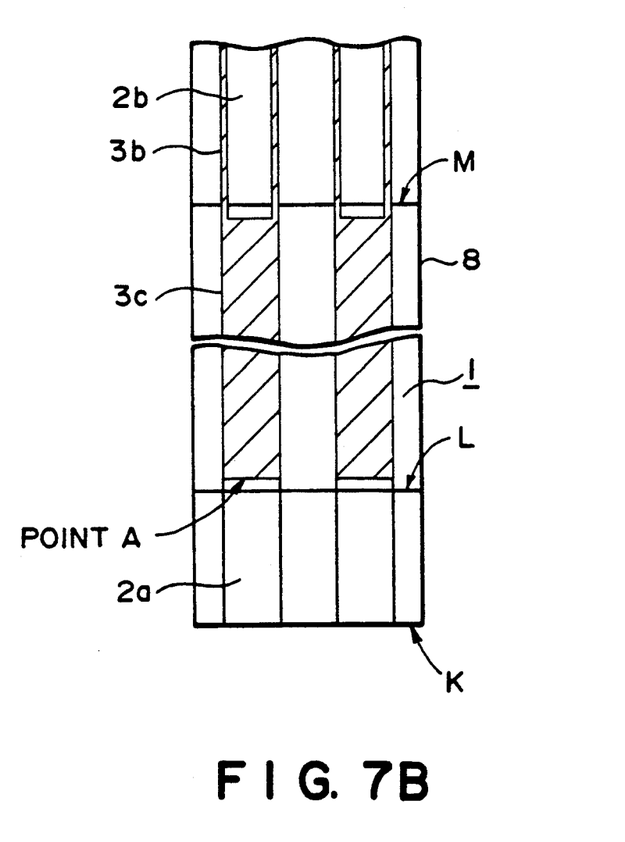
FIG. 7B is a plan view of the substrate 8 used in the apparatus shown in FIG. 7A.

FIGS. 7A and 7B show an apparatus to which the present invention is not applied. This apparatus uses the same substrate 8 shown in FIG. 5A except that the narrow metal thin film 3a used in the present invention is omitted.

Figure 8:
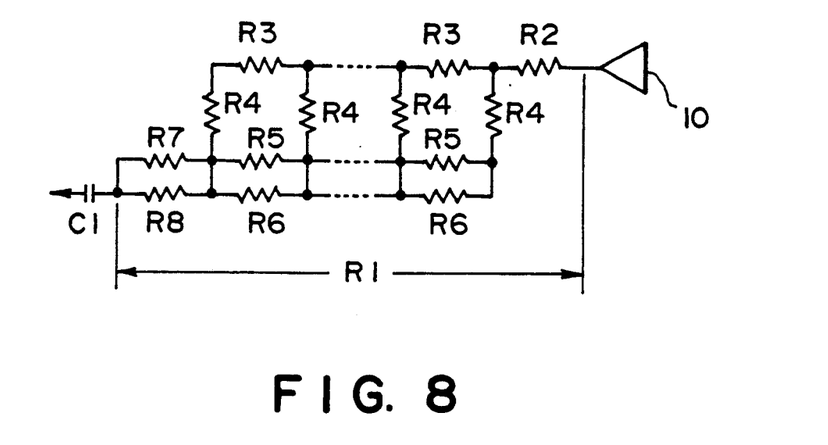
FIG. 8 is an equivalent circuit diagram of the apparatus according to the present invention.
Figure 9:
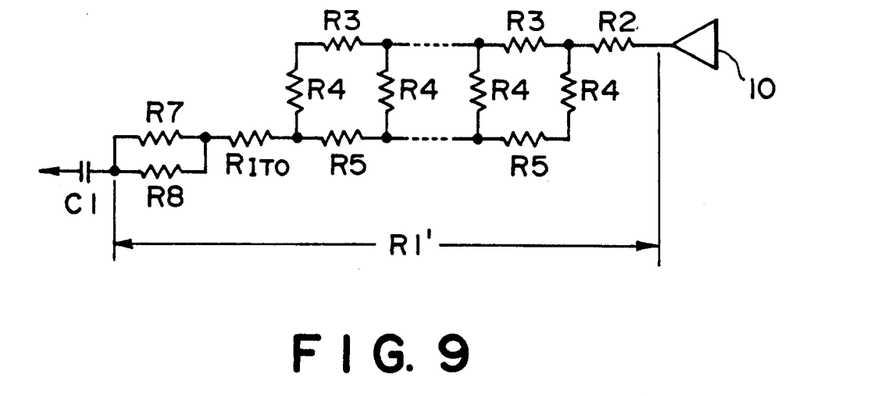
FIG. 9 is an equivalent circuit diagram of the apparatus shown in FIG. 7A.

FIG. 8 is an equivalent circuit of the apparatuses shown in FIGS. 3, 4, 5A and 5B. R2 represents a wiring resistance of the connection electrode 5 from the external drive circuit 10 to the solder particle No. 2 nearest to the external circuit 10, R3 represents a wiring resistance of the connection electrode 5 between two adjacent solder particles, R4 represents a wiring resistance of the ITO thin film between two adjacent solder particles, Rb represents a wiring resistance of the narrow metal thin film 3a between two adjacent solder particles, R7 represents a wiring resistance of the ITO thin film from the point A to the liquid crystal material, and R8 represents a wiring resistance of the metal thin film 3c from the point A to the liquid crystal. The values of these resistances are the same both for the apparatus of the present invention and the apparatus to which the present invention is not applied.

Figure 10:
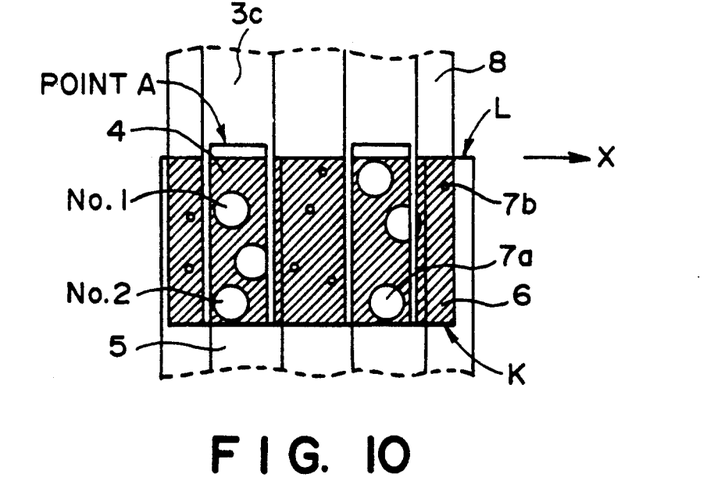
FIG. 10 is a plan view of the apparatus according to another embodiment of the present invention.

According to the method to which the present invention is not applied, a wiring resistance R12 from the external drive circuit 10 and the liquid crystal material is greatly dependent upon the distance a from the point A of the metal thin film 3c to the solder particle No. 1 nearest to the metal thin film 3c and the resistance Rito of the ITO electrode 2a. The sheet resistance value of the ITO electrode 2a is several tens times as large as that of the metal thin film 3c. The distance a varies with the dispersion degree of solder particles, and it is inevitable in many cases that the distance a takes a maximum of about 500 microns. According to the connection arrangement of the present invention, electrical connection is reliably obtained by means of the ITO opening area 4, and the metal thin film 3a is left at the opposite ends (side edge portions) of the connection electrode 1 of the liquid crystal panel so that the distance from the solder particle 7a to the metal thin film 3a is made several microns or less. Therefore, the above-described two problems can be eliminated. FIG. 10 shows the case where the connection electrode 1 of the liquid crystal panel 111 is positioned facing the connection electrode 5 of the film carrier, both the electrodes being displaced in the direction indicated by X.

Consider the case where the ITO opening area 4 having a width of, e.g., 80 microns is formed in the connection electrode 1 of the liquid crystal panel 111 at the central area thereof, and a parallel pattern of metal thin films of about 10 microns runs at the opposite side edge portions of the electrode. In such a case, even if the connection electrode 1 of the liquid panel 111 and the connection electrode 5 of the external drive circuit displace from each other by 10 microns for example in the direction indicated by X in FIG. 10, it is possible to obtain electrical connection without reducing the contact area and prevent the wiring resistance R1 from increasing.

Figure 11:
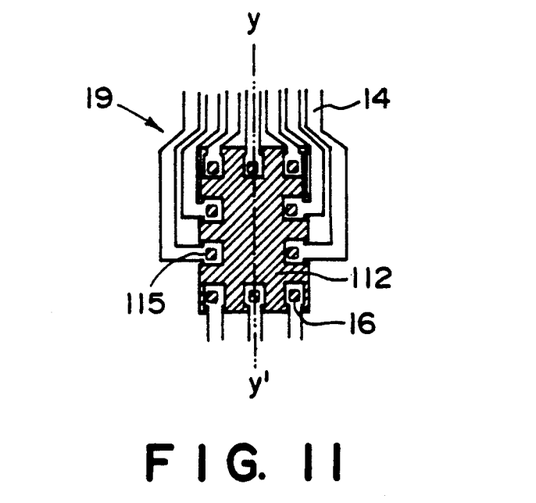
FIG. 11 is a plan view showing a connection between a liquid crystal panel connection electrode of the present invention and a drive IC in a bare chip state.
Figure 12:
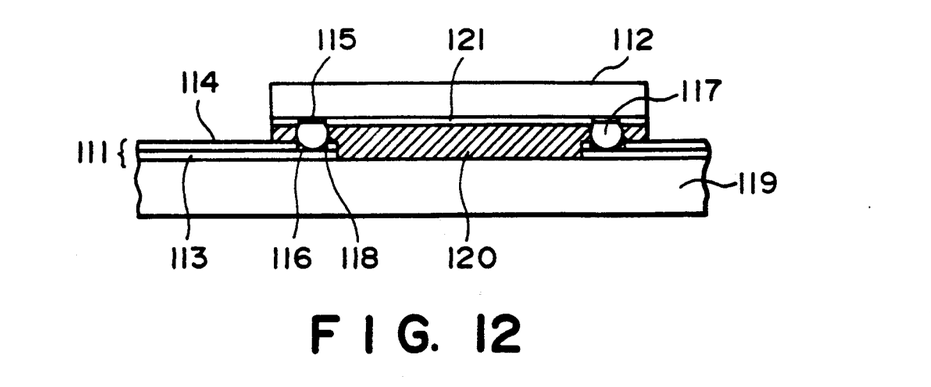
FIG. 12 is a cross section taken along line y—y'.

FIGS. 11 and 12 show an electrical connection between a connection electrode 111 of a liquid crystal panel and a drive IC 112 of a bare chip state. FIG. 12 is a cross section taken along line y—y' of FIG. 11. The connection electrode 111 of the liquid crystal panel has a two-layer structure including an ITO thin film 113 and metal thin film 114. An ITO opening area 116 is formed in the connection electrode 111 at the central area thereof facing the connection electrode 115 of the drive IC 112. A metal bump (gold, silver, copper, or the like) 17 is formed between the ITO opening area 116 and the connection electrode 115 of the drive IC 112. Both the electrodes (the ITO opening area 116 and the connection electrode 115) are connected together using conductive paste 118 interposed therebetween. Electrical connection is obtained at the ITO opening area 116 so that the connection reliability can be improved, and because of a presence of the metal thin film 114 near the ITO opening area the wiring resistance from the drive IC 112 to the liquid crystal material can be made small. In FIG. 12, reference numeral 120 represents an epoxy-based adhesive agent, and reference numeral 121 represents an insulating film such as $SiO_2$ and polyimide.

As described above, the connection electrode of a liquid crystal panel is made to have a two-layer structure of an ITO thin film and metal thin film, and an ITO opening area is formed. Therefore, connection to the connection electrode of an external drive circuit can be obtained with high reliability, and the wiring resistance from the external drive circuit to the liquid crystal material can be made small.

The ITO opening area is formed in the connection electrode of a liquid crystal panel at the central area thereof. Therefore, even a positional displacement relative to the external drive circuit occurs during connection work, the connection reliability can be prevented from being lowered due to a reduction of contact area.

What is claimed is:

1. A liquid crystal apparatus comprising:
    a liquid crystal panel side electrode extending from a liquid crystal panel; and
    an external circuit side electrode extending from an external circuit and connected to said liquid crystal panel side electrode for driving said liquid crystal panel, by using conductive material,
    wherein said liquid crystal panel side electrode comprises a laminated film made of an indium tin oxide film having a surface and a metal film on the surface, the metal film being a selected one of a molybdenum and an aluminum film, and said liquid crystal panel side electrode has a left portion of the metal film and an indium tin oxide film opening area, at a connection area between said liquid crystal panel side electrode and said external circuit side electrode, the indium tin oxide film of said liquid crystal panel side electrode being covered with the metal film over the entire surface thereof except at the indium tin oxide film opening area, and wherein said liquid crystal panel side electrode is formed in a stripe shape, and the left portion of the metal film of said liquid crystal panel side electrode at the connection area is formed to have a width 1/30 to ⅓ times as narrow as a width of said stripe.

2. A liquid crystal apparatus according to claim 1, wherein the left portion of the metal film of said liquid crystal panel side electrode at the connection area is formed to have a width 1/30 to ⅓ times as narrow as the width of the stripe along the longitudinal direction of the stripe at opposite ends of the strip.

3. A liquid crystal apparatus according to claim 1, wherein the conductive material comprises metal particles.

4. A liquid crystal apparatus according to claim 1, wherein the conductive material comprises metal plated resin particles.

* * * * *

UNITED STATES PATENT AND TRADEMARK OFFICE
CERTIFICATE OF CORRECTION

PATENT NO. : 5,270,848
DATED : December 14, 1993
INVENTOR(S) : HIROSHI TAKABAYASHI, ET AL.

It is certified that error appears in the above-indentified patent and that said Letters Patent is hereby corrected as shown below:

<u>COLUMN 6</u>

Line 35, "denum" should read --denum film--
Line 55, "strip." should read --stripe.--.

Signed and Sealed this

Second Day of August, 1994

Attest:

BRUCE LEHMAN

Attesting Officer     Commissioner of Patents and Trademarks